(12) United States Patent
Hsieh et al.

(10) Patent No.: US 7,142,429 B2
(45) Date of Patent: Nov. 28, 2006

(54) HEAT SINK AND RETAINING CLIP ASSEMBLY

(75) Inventors: George Hsieh, Portland, OR (US); George R. Anderson, Milwaukie, OR (US); Cheryl M. Floyde, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/230,875

(22) Filed: Sep. 20, 2005

(65) Prior Publication Data

US 2006/0012960 A1    Jan. 19, 2006

Related U.S. Application Data

(62) Division of application No. 10/262,599, filed on Oct. 1, 2002, now Pat. No. 6,947,283.

(51) Int. Cl.
   *H05K 7/20* (2006.01)
(52) U.S. Cl. ............... 361/710; 361/704; 361/709; 165/80.3; 257/706; 174/16.3
(58) Field of Classification Search ........ 361/702–712, 361/714–719, 687–689; 257/706–727; 174/16.3; 165/80.3, 185; 248/505, 510; 24/453, 457, 24/458
   See application file for complete search history.

(56) References Cited

U.S. PATENT DOCUMENTS

| | | |
|---|---|---|
| 4,509,839 A | 4/1985 | Lavochkin |
| 5,184,281 A | 2/1993 | Samarov |
| 5,373,099 A | 12/1994 | Boitard et al. |
| 5,381,305 A | 1/1995 | Harmon et al. |
| 5,386,338 A | 1/1995 | Jordan et al. |
| 5,428,897 A | 7/1995 | Jordan et al. |
| 5,570,271 A | 10/1996 | Lavochkin |
| 5,640,305 A | 6/1997 | Smithers |
| 5,784,257 A | 7/1998 | Tata |
| 5,910,884 A | 6/1999 | Garza et al. |
| 5,932,925 A | 8/1999 | McIntyre |
| 5,990,552 A | 11/1999 | Xie et al. |
| 6,021,044 A | 2/2000 | Nevelie, Jr. et al. |
| 6,144,092 A | 11/2000 | Kappes |
| 6,311,765 B1 | 11/2001 | Lo |
| 6,424,530 B1 | 7/2002 | Lee et al. |
| 6,518,507 B1 * | 2/2003 | Chen ................... 174/252 |
| 6,661,663 B1 | 12/2003 | Meeker |
| 6,768,641 B1 * | 7/2004 | Li ..................... 361/719 |
| 6,947,283 B1 | 9/2005 | Hsieh et al. |

* cited by examiner

*Primary Examiner*—Michael Datskovskiy
(74) *Attorney, Agent, or Firm*—Schwegman, Lundberg, Woessner & Kluth, P.A.

(57) ABSTRACT

Apparatus and methods for secure attachment of a heat sink to its respective retention clip as well as attachment to an electronic device are presented. One embodiment of a retention clip retention apparatus consists of a protruding hip depending from a side of a heat sink protrusion adapted to capture the retention clip between the hip and the heat sink body. One embodiment of a method for forming the hip consists of using a tool to deform the heat sink protrusion. One embodiment of heat sink lateral retention apparatus consists of one or more split bobbins adapted to attach to the retention clip to prevent lateral motion of the heat sink with respect to the clip.

24 Claims, 9 Drawing Sheets

HEAT SINK AND RETAINING CLIP ASSEMBLY

RELATED APPLICATION(S)

This application is a Divisional of U.S. application Ser. No. 10/262,599 filed Oct. 1, 2002 now U.S. Pat. No. 5,947,283 which is incorporated herein by reference Electronic devices, such as integrated circuit (IC) chip packages, are well known and commonly used to perform a variety of electronic functions. In use, it has been found that some electronic devices often produce significant levels of heat. As a consequence, various methods have been employed to assist in cooling electronic devices.

One well-known method for cooling IC chip packages, for example, involves mounting a device known as a heat sink to a surface of the IC chip package. The heat sink commonly has a flat surface which contacts a surface of the IC chip package. Commonly, a plurality of fins or pins extend substantially perpendicularly from a surface of the heat sink. The protruding pins assist in transporting thermal energy away from the IC chip package by providing a relatively large surface area for convective heat transfer as compared with the surface are of the IC chip package. The heat sink is fabricated from a material having a high thermal conductivity for efficient thermal transfer between the IC chip package and the surrounding environment.

Various methods have been used to mount heat sinks to the surface of IC chip packages. The art has recognized certain advantages of avoiding the use of adhesives, screws, bolts and the like, and has often relied on the use of retaining clips.

FIG. 1 is a perspective view of a prior art assembly of a heat sink 10 which includes a heat sink plate 11, an electronic device 20, a mounting frame or base 30 and a retaining clip 40. It shows the prior art heat sink 10 in an assembled configuration with electronic device 20 coupled to mounting frame 30 and heat sink 10 placed upon and in contact with electronic device 20. Heat sink 10 is thermally coupled to the top surface of the electronic device 20 by clip 40, the distal ends or legs 42 of which are engaged with tabs 12 that project from opposite sides of mounting frame 30.

Once legs 42 of clip 40 are secured under tabs 12, clip 40 provides a spring bias force to the heat sink 10 relative to base 30, thereby forcing a surface of heat sink 10 into contact with the surface of the electronic device 20. In this embodiment of a prior art clip 40, the clip comprises a bent wire having two distal legs 42 extending from an elongated clip central portion 44 which extends therebetween. As shown in FIG. 2, legs 42 are substantially perpendicular to central portion 44, and extend, in the embodiment shown, from central portion 44 in opposing directions forming clip 40 into what may be described as a generally Z-shaped configuration. Further, mounting frame 30 as shown in FIG. 2 is coupled to a substrate 50, such as a printed circuit board.

In the prior art arrangement of FIG. 1, the clip central portion 44 is received within a longitudinal groove 52 that is defined between adjacent rows of heat sink pins 54. The clip central portion 44 is oriented substantially parallel to and rests upon heat sink surface 56 of plate 11 from which pins 54 project.

In the arrangement shown in FIG. 1, heat sink 10 is secured to the electronic device 20 by tucking an leg or attachment portion 42 of clip 40 under the projecting tabs 12 of the base 30 upon which the electronic device 20 is mounted. Tucking the legs 42 under the tabs 12 provides a torsional spring-bias force to clip 40 that forces clip central portion 44 firmly against heat sink top surface 56 in longitudinal groove 52. This spring-bias secures heat sink 10 against electronic device 20 to enable good thermal contact between the heat sink 10 and the electronic device 20. It does not, however, restrain the heat sink 10 from longitudinal sliding movement relative clip 40 along groove 52. Such relative motion between the clip 40 and heat sink 10 along the axis of clip central portion 44 is also referred to herein as lateral movement of the heat sink. This lateral movement is distinguished from vertical movement of the heat sink 10 away from the surface of electronic device 20.

Further, in the prior art embodiment shown, heat sink 10 and clip 40 comprise two separate parts, which are not secured to each other before assembly with the electronic device 20. Clip 40 is not secured to the heat sink 10, but only engages the heat sink 10 when it is mounted with an electronic device 20. Accordingly, when the heat sink 10 is not attached to electronic device by clip 40, clip 40 is a loose part. As such, clip 40 may damage other components if it is dropped during assembly. In addition, the clip 40, being a loose part, precludes preassembly of clip 20 to the heat sink 10 prior to assembly of the heat sink assembly with the electronic device. Attachment of clip 40 to the heat sink 10 prior to assembly provides numerous advantages, such as, but not limited to, ease of assembly during the attachment of the heat sink 10 to the electronic device, reduction of the risks posed by a loose clip 40 including possible damage to other components.

It is well recognized that accurately positioning heat sink 10 relative to electronic device 20 is crucial for proper thermal management. For optimal thermal efficiency, the electronic device 20 should be centered and its contact surface should be aligned under, and in full contact with heat sink 10 such as shown in the sectional elevation view of FIG. 2. After a surface of heat sink 10 is forced into contact with a surface of the electronic device 20 by the clip 40, there remains a potential for the heat sink 10 to shift or move laterally along clip central portion 44 relative to the electronic device 20. Mechanical shock or vibration during transportation and handling, for example, among other possible disturbances, can cause such undesired lateral shifting of the heat sink 10.

FIG. 3 is a cross-sectional view of an embodiment of a prior art device which illustrates a problem caused by lateral shifting of the heat sink 10 along the central portion 44 of clip 40 from the centered position illustrated in FIG. 2 to a laterally displaced position. Once it is so shifted, heat sink 10 has lost contact with a portion of the top surface of the electronic device 20. Such lateral heat sink movement is undesirable since it fails to maintain efficient thermal contact between the electronic device 20 and the heat sink 10.

DETAILED DESCRIPTION

Figure 1:
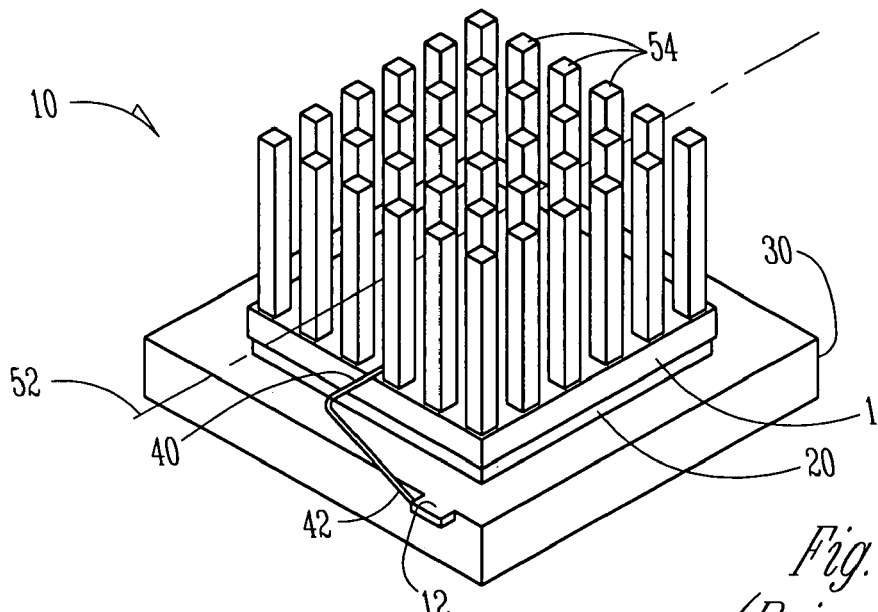
FIG. 1 is a perspective, view of a prior art heat sink, electronic device and clip assembly.

In the following detailed description, reference is made to the accompanying drawings, which are not necessarily to scale, which form a part hereof, and in which is shown by way of illustration specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

The following figures refer to an electronic device, for example an integrated circuit (IC) chip package, to which a heat sink is attached with a retaining clip to form a heat sink assembly. The invention is not limited to heat sinks used with electronic circuits in computer assemblies. It works with any apparatus having a heat emitting device and a heat sink.

Heat sink 10 is manufactured from a material having good thermal conductivity, such as, but not limited to, aluminum and copper. This allows for the efficient conduction of heat from the electronic device 20 to the heat sink 10. Heat is subsequently conducted through the heat sink plate to the pins 54 and transferred to the surrounding environment by convection and radiation.

In one embodiment of the invention, mounting frame 30 incorporates a clip attachment structure, such as the tab 12 shown in FIG. 1, to cooperate with the leg portions 42 extending from the ends of clip 40. The clip attachment tab structure tab 12 projects from opposite sides of mounting frame 30. In other embodiments, clip attachment structure 12 may be a pocket, protrusion, ledge, or an aperture. The choice of the particular configuration for an attachment structure 12 may depend the specific geometry of the chip mounting arrangement used.

In many of the embodiments of the present invention which are illustrated, clip 40 is a formed cylindrical metal wire. In other embodiments the clip 40 may take the form of, for example, but not limited to, a strap, a band, or a flat wire. The clip 40 can be formed from any material suitable for the intended use, such as, but not limited to, metal and plastic.

In one embodiment, clip 40 is comprised of a resilient material, such that when it is twisted it produces a torsional spring-bias force tending to return to an original shape. In one embodiment, the clip 40 comprises a spring metal.

A thermal conduction aid 26 is commonly applied to the top surface of the electronic device 20. Thermal conduction aid 26 makes a thermally efficient contact between the mating surface 24 of electronic device 20 and heat sink plate 11. Examples of suitable thermal conduction aids 26 include, but are not limited to, thermal conductive grease, soft metallic foil, and metal-impregnated paste.

Figure 4:
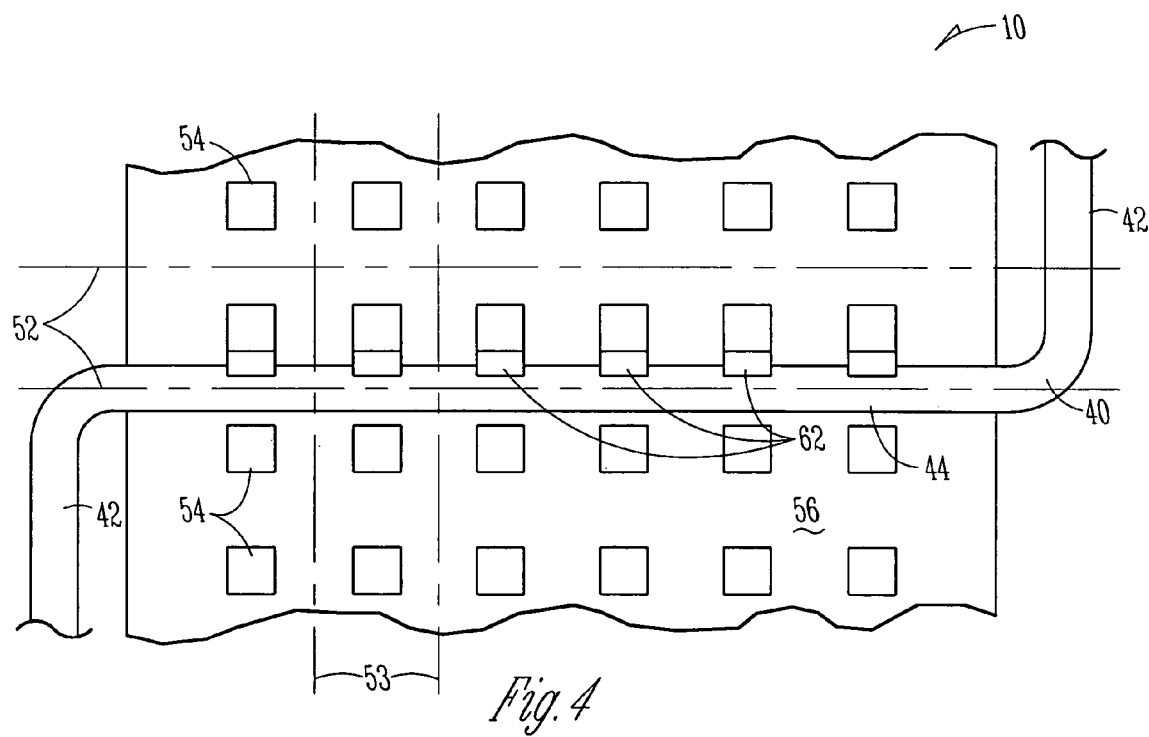
FIG. 4 is a detail of a top view of an embodiment of clip retention apparatus in accordance with the present invention.

FIG. 4 is a top plan view of an embodiment of the invention. In the embodiment shown, heat sink 10 has a plurality of pins 54 extending upwardly from a surface 56 of heat sink plate 11. The pins 54 are arranged in longitudinally and transversely oriented rows defining lateral longitudinal grooves 52 aligned with central portion 44 of clip 40 and lateral transverse grooves 53 which are substantially perpendicular to grooves 52. Longitudinal grooves 52 and, in some cases transverse grooves 53, are adapted for receiving clip central portion 44.

One or more of pins 54 has a retaining member 62 projecting from the surface thereof into groove 52 for retaining the clip central portion 44 in groove 52. Various embodiments characterized by different configurations of retaining member 62 are also illustrated in FIGS. 5 through 12 below.

In some embodiments retaining member 62 is adapted to allow the insertion of clip central portion 44 into groove 52 to retain clip 40 within groove 52. One skilled in the art can appreciate that the retaining member 62 projecting from pin 54 can, in further embodiments, take other suitable forms and still function to readily allow the attachment of the clip 40 to the heat sink 10 while resisting unintended separation from it. Retaining members 62 can be provided on just a single pin 54 or can be provided on multiple pins 54 along one or both sides of the groove 52, as will be discussed in connection with the embodiments of the following examples.

Figure 5:
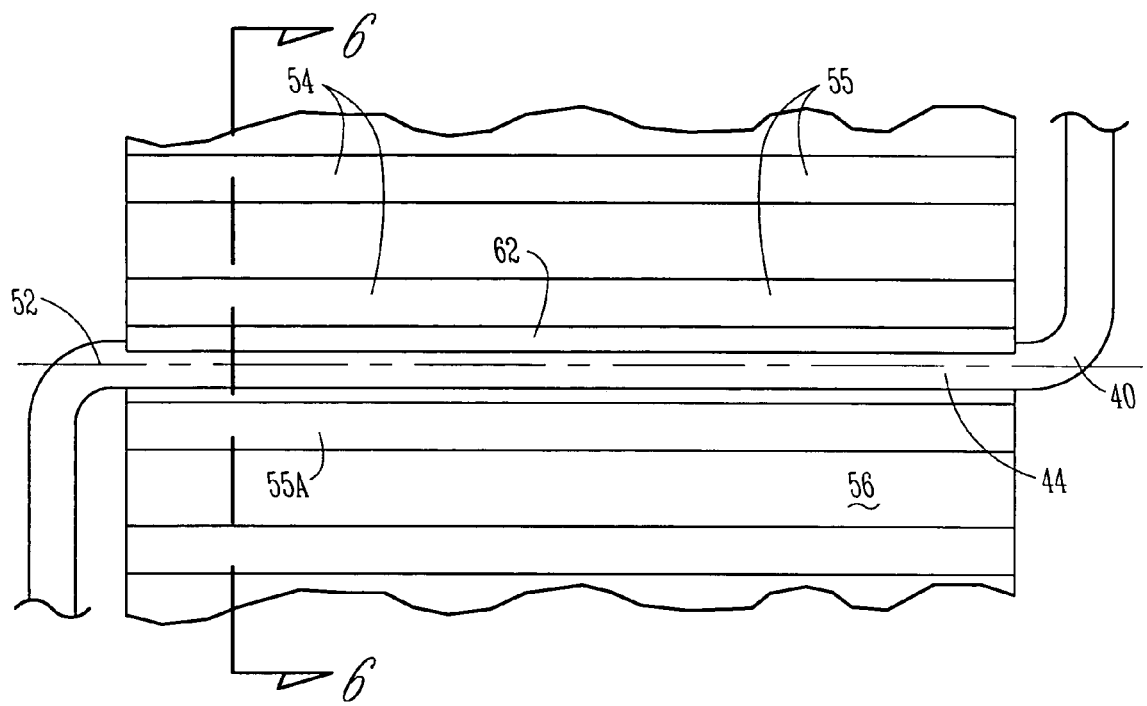
FIG. 5 is detail of a top view of another embodiment of a heat sink clip retention apparatus in accordance with the present invention.

FIG. 5 is a top plan view of an embodiment of the assembly where pins 54 are longitudinally extended as fins 55 that extend substantially along the entire length of groove 52 cross the entire width of surface 56 of heat sink plate 11. Retaining member 62 is provided on a fin 55 which defines one wall of a longitudinal groove 52. Retaining member 62 keeps central clip portion 44 vertically restrained in groove 52.

Retaining member 62 is shown in various embodiments in FIGS. 5–9. In one embodiment, the retaining member 62 may extend for only a portion of the length of the fin 55. In the embodiment shown in FIG. 5, the retaining member 62 extends substantially the entire length of the fin 55. In yet another embodiment, not shown, a plurality of retaining members 62 extend at least a portion of the length of fin 55, the plurality of retaining members 62 being substantially collinear and substantially parallel with surface 56. The geometric relationship of the retaining member 62 and the adjacent fin 55A defines a clip retaining groove 52 which prevents the undesired removal of the clip 40 from groove 52 by moving it upwardly from surface 56.

There are a number of ways in which retaining members 62 may be formed on pins 54. In one embodiment, shown in FIG. 5, heat sink 10, fins 55 and 55A and longitudinal groove 52 between adjacent fins 55 and 55A are extruded from a billet of material by extruding the material along an extrusion axis corresponding to the axis of longitudinal groove 52. Transverse cuts may be made, by a suitable and known machining or sawing process, in fins 55 and 55A to provide separate pins 54 and form transverse grooves 53, oriented substantially perpendicular to grooves 52. The sawing divides fins 55 and 55A into a plurality of pins 54. Since the faces of fins 55 and 55A on both sides of groove 52 are formed by extrusion rather than cutting, it can be seen that modification of the extrusion dies can readily facilitate the forming of retaining members 62 as part of an extrusion process.

In the embodiment of FIG. 5, the retaining member 62 extends from a plurality of adjacent fins 55 and 55A. That embodiment is an example of a heat sink 10 that is adapted to accommodate a clip 40 having a substantially straight central portion 44.

In various other embodiments, the location of the pins 54 that are selected to have retaining members 62 formed thereon depends on the configuration of the central portion 44 of the clip 40. As shown in FIGS. 6–11, any one or more of pins 54 may have retaining members 62 of various shapes for retaining the clip 40. A plurality of such retaining members 62 need not necessarily be collinearly arranged. Clips 40 having a central portion 44 that may follow an other than straight path across surface 56 of heat sink 10, can also be accepted in the embodiments discussed below as shown in FIGS. 13–20.

Figure 6:
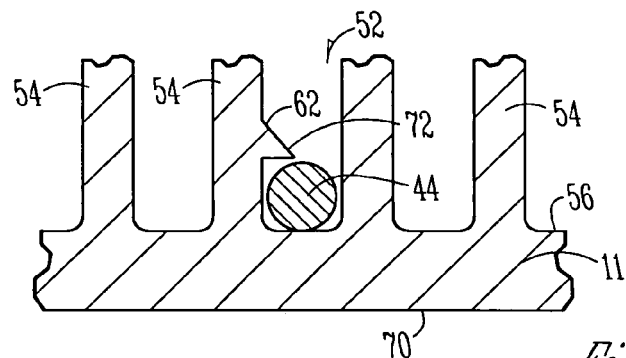
FIG. 6 is a cross sectional detail elevation view taken along section line 6–6' respectively of FIG. 5.

FIG. 6 is a sectional elevation view taken along section line 6–6' of FIG. 5 which illustrates an embodiment of the present invention. The heat sink 10 comprises a plate or base 11 having a surface 70 for engaging a surface of a device to be cooled. Heat sink plate 11 has a plurality of pins 54 that extend upwardly from another surface 56. The plurality of adjacent, generally parallel, rows of pins 54 define at least one longitudinal groove 52 therebetween which is adapted to retain clip central portion 44 therein. At least one pin 54 has a retaining member 62 extending from the surface of pin 54 into groove 52.

In the embodiment shown in FIG. 6, retaining member 62 has wedge shape which, when viewed in cross section, includes a face 72 that slopes downwardly toward surface 56 as the body of retaining member 62 projects inwardly into groove 52. In the embodiment shown, the shape of retaining member 62 is adapted to allow clip central portion 44 to be introduced into groove 52 from above the retaining member 62, pass between the retaining member 62 and the adjacent pin 54, and to subsequently be retained between the retaining member 62 and the surface 56 of heat sink plate 11. The spacing between retaining member 62 and pin 54 lying across groove 52 from it is selected such that central portion 44 of clip 40 is restrained from being readily removed from groove 52. In one embodiment, one or both of pins 54 and/or the retaining member 62 is resilient to facilitate the insertion of clip 40 into groove 52. The resiliency is sufficient to allow retaining member 62 to substantially return to its original shape after introduction of the clip 40 in order to restrict the removal of the clip 40 from the groove 52.

Figure 7:
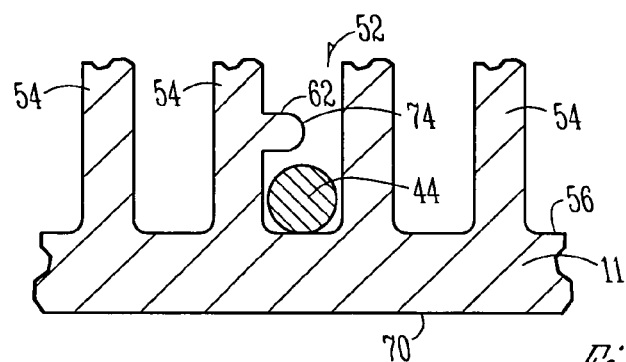
FIGS. 7–12 are cross sectional detail elevation views showing further embodiments of a clip and heat sink assembly with the views taken similarly to the view of FIG. 6.

FIG. 7 is a cross-sectional view of an embodiment showing the use of a rounded retaining member 62 having a rounded surface 74 extending from a side of pin 54 and extending toward an adjacent pin 54 on the other side of groove 52.

Figure 8:
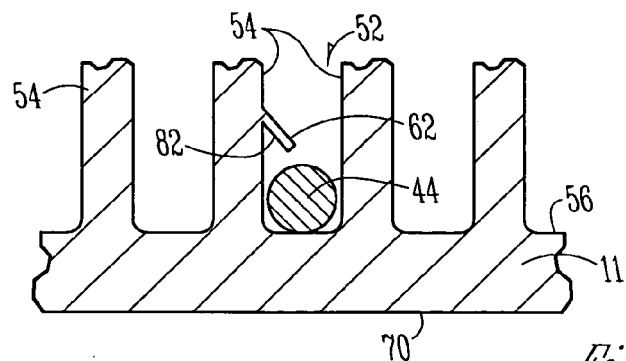

FIG. 8 is a cross-sectional view of another embodiment. At least one pin 54 further comprises a retaining member 62, resembling in cross-section, a flap extending from a side of the pin 54. In this embodiment retaining member 62 slopes downwardly and is oriented toward surface 56 and also toward an adjacent pin 54 which defines the other side of groove 52. It has a partially cut-away lower surface 82.

Figure 9:
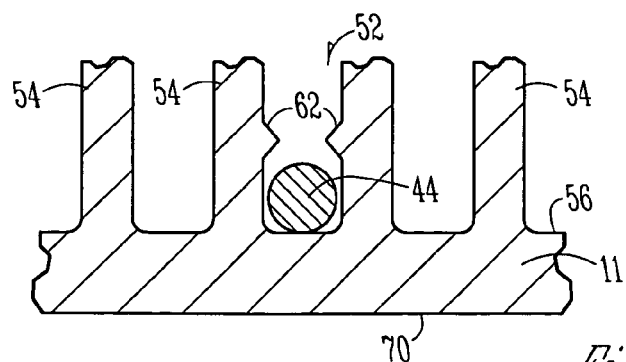

FIG. 9 is a cross-sectional view of a further embodiment. One or more pairs of opposing retaining members 62 project inwardly into groove 52 in an opposing relationship from adjacent pins 54 which define opposite sides of groove 52. The spacing and dimensions of the pair of opposing retaining members 62 and width of groove 52 are selected so as to trap and retain central portion 44 of the clip 40 within the groove 52. In one embodiment, the pair of opposing retaining members 62 are resilient to allow the insertion of clip 40, with the pair of opposing retaining members 62 substantially returning to an original shape after the insertion of the clip 40 to prevent unintended removal of the clip 40 from the groove 52.

In an embodiment of the invention wherein more than one retaining member 62 projects into groove 52, the retaining members 62 each project from sides of the pins 54 in a co-linear and co-planar relationship, and at a substantially equal height above surface 56, such as shown with the pair of retaining members 62 shown in FIG. 9. In that embodiment, the retaining members 62 are located at substantially the same distance above the surface 56 such that the clip 40 may be restrained between retaining member 62 and the second surface 56. Clip 40 in these embodiments may be retained by the retaining members 62 at any one or more of a number of places along the central portion 44 of the clip 40, as shown, for example, in FIG. 4.

In other embodiments of the invention, where more than one retaining member 62 extends into longitudinal groove 52, the retaining members 62 may not project from sides of the adjacent pins 54 in a co-linear and co-planar relationship, as will be discussed in connection with further embodiments below.

In several of the embodiments discussed above, retaining member 62 projects into the groove 52 a distance sufficient to retain the clip 40 within the groove. This distance is dependent on the width of the groove 52 and the width of the clip 40. In an embodiment of the invention, the gap between the end of the retaining member 62 and either adjacent retaining member 62 or pin 54 is less than the width of the clip central portion 44.

In one embodiment of the invention, not shown, wherein the material of clip 40 is in the form of a thin band, clip 40 may be rotated 90 degrees prior to insertion into the groove such that the clip passes beyond the retaining member 62 in an edge-on fashion, and is subsequently rotated 90 degrees to allow retaining member 62 to retain the clip within the groove.

Figure 12:
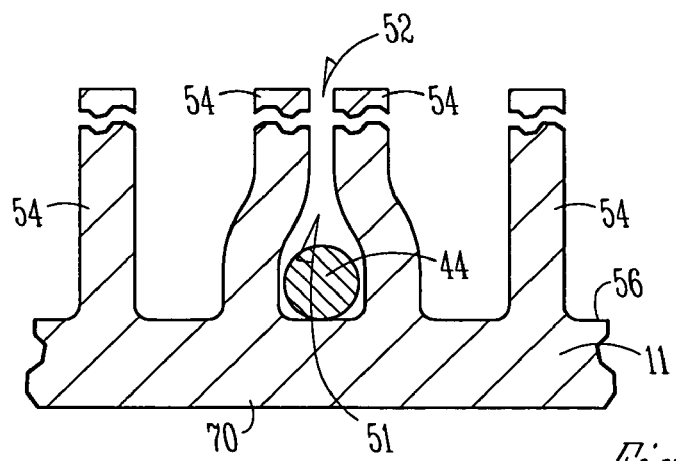

Also in some embodiments of the invention, the projection 62 extends from a side face of pin 54 to form a retention barrier in groove 52 which is sufficiently above surface 56 to define a space 51, shown in FIG. 12, in which the central portion 44 is retained. The distance above the surface 56 that the retaining member 62 is located depends, in part, on the height, or the cross sectional diameter, of the clip central portion 44. In one embodiment, for example, the distance above the surface 56 from which the retaining member 62 extends, as well as the width of the groove 52, are substantially equal to or slightly greater than either the diameter or the height and width of the central portion 44. In other embodiments of the invention, it may be advantageous to position the retaining member 62 at a somewhat greater height above surface 56.

Figure 10:
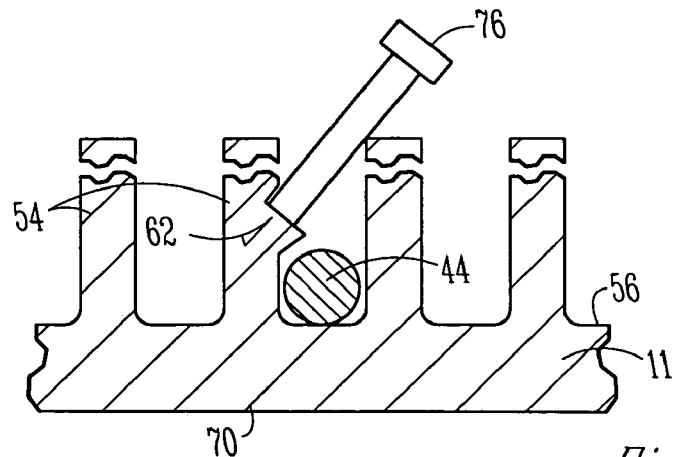

FIG. 10 is a cross-sectional view of an embodiment of a heat sink 10 in which at least one pin 54 has a staked retaining member 62. The assembly manufacturing method utilized for that embodiment comprises inserting a clip 40 into a groove 52 defined by adjacent rows of pins 54. The inserted clip 40 is retained by staked retaining member 62 in close proximity to surface 56 of the heat sink 10. The cross section of central portion 44 of clip 40 and the width of groove 52 are configured to substantially match. In the embodiment of FIG. 10, a metal working tool such as staking tool 76 is used to deform at least a portion of at least one pin 54 located at one side or wall of the groove 52 into which the clip 40 had previously been placed. When a staking force is applied, tool 76 permanently deforms the pin 54 to form retaining member 62. A clip retaining space is created between retaining member 62 and the surface 56 to accommodate the portion of clip 40 contained within it so as to retain clip 40 within groove 52. Other examples of a metal working tool 76 which could be employed include, but are not limited to, chisels or crimping tools.

Figure 11:
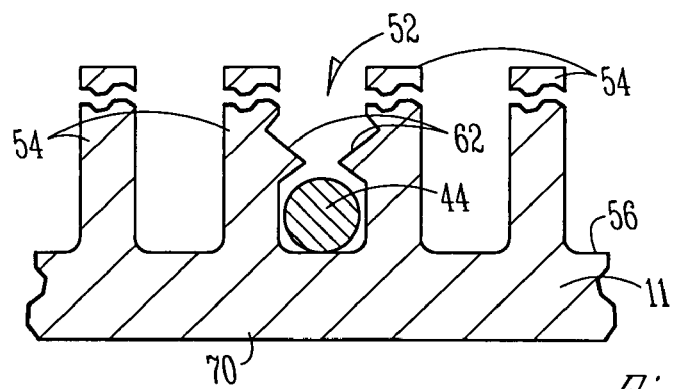

FIG. 11 is a cross-sectional view of a heat sink constructed in accordance with another embodiment of the method. The method comprises inserting central portion 44 of a clip 40 into a groove 52 that is defined by adjacent rows of pins 54. Clip 40 is also positioned in close proximity to the surface 56 of the heat sink 10. The width of groove 52 and the width and cross sectional configuration of the central portion 44 of clip 40 are chosen so that the clip lies in the groove 52. A metal working tool is used to deform at least a portion of pins 54 on opposite sides of groove 52 into which the clip 40 is placed. The tool works pins 54 to form two cooperating opposed retaining members 62 that provide an upper restraining boundary for a clip receiving space in groove 52. Retaining members 62, in cooperative relationship, protrude sufficiently into the groove 52 to retain the clip 40 within groove 52.

FIG. 12 is a cross-sectional view of a further embodiment. In that embodiment, the method of retaining a clip 40 in a heat sink 10 comprises initially inserting a clip 40 into a groove 52 defined by adjacent rows of pins 54 so that the clip 40 is placed in space 51 in close proximity to the surface 56 of the heat sink 10. The width of the clip 40 generally matches that of groove 52. One or more pins 54 adjoining groove 52 are subsequently deformed by bending them together at their end portions which are distal to surface 56 so as to narrow groove 52 above clip 40 to prevent undesired removal of the clip from groove 52. In one embodiment, the narrowed groove 52 is formed by the squeezing action of a tool, such as a crimping tool, against opposing pins 54.

Figure 2:
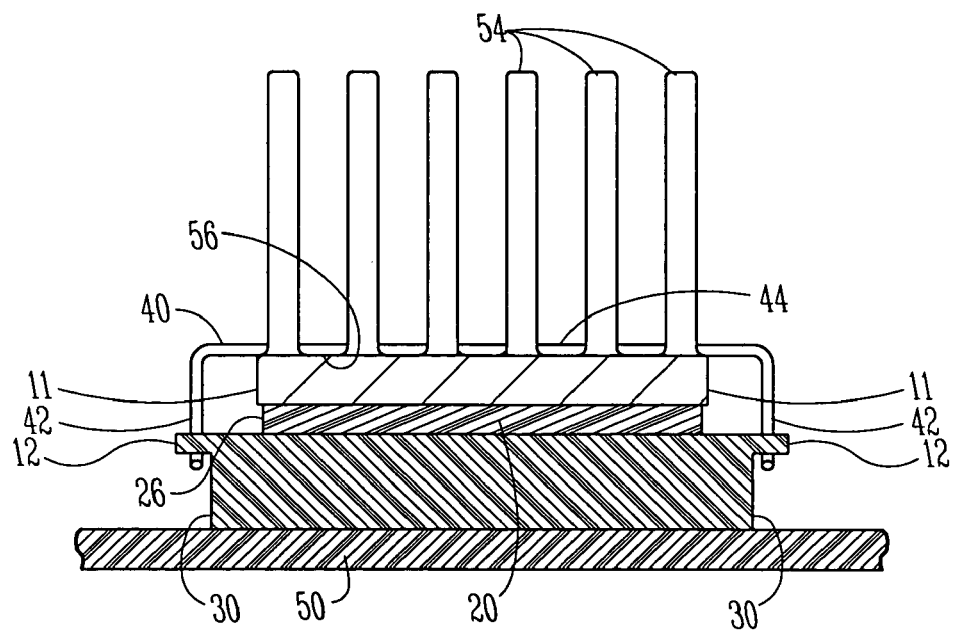
FIGS. 2 and 3 are cross-sectional views of a prior art heat sink assembly.
Figure 3:
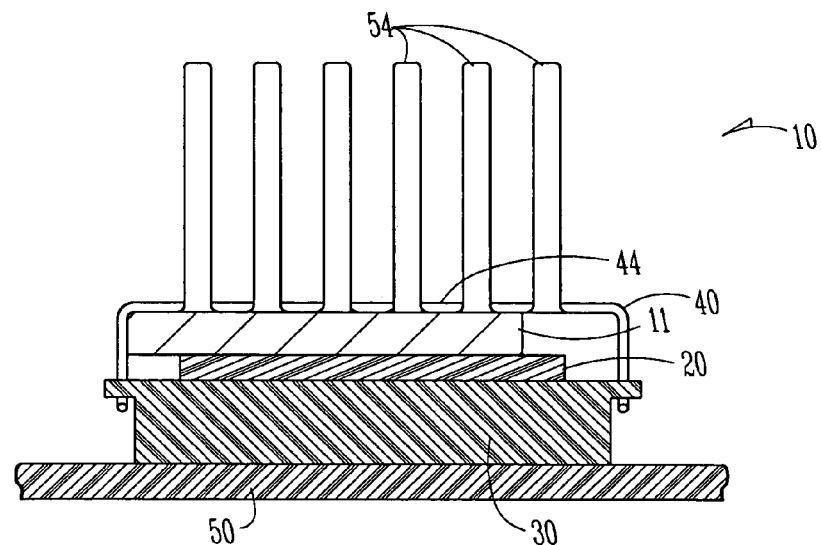

The maintenance of proper lateral positioning of heat sink 10 relative to a heat emitting surface of electronic device 20 is also important for proper thermal management. For optimal thermal efficiency, electronic device 20 should remain centered under and in full contact with the heat sink 10 in the aligned arrangement shown in FIG. 2. Once heat sink 10 is positioned and restrained against electronic device 20 by clip 40, it retains a potential for shifting or moving laterally by moving longitudinally along the axis central portion 44 of clip 40 in the plane of contact with the electronic device 20. When heat sink 10 has undergone such lateral movement relative to clip 40 and electronic device 20 it may assume the sort of misalignment shown in FIG. 3, for example. Mechanical shock which may often be encountered during transportation and in the course of handling, for example, can cause such shifting of the heat sink 10.

Figure 13:
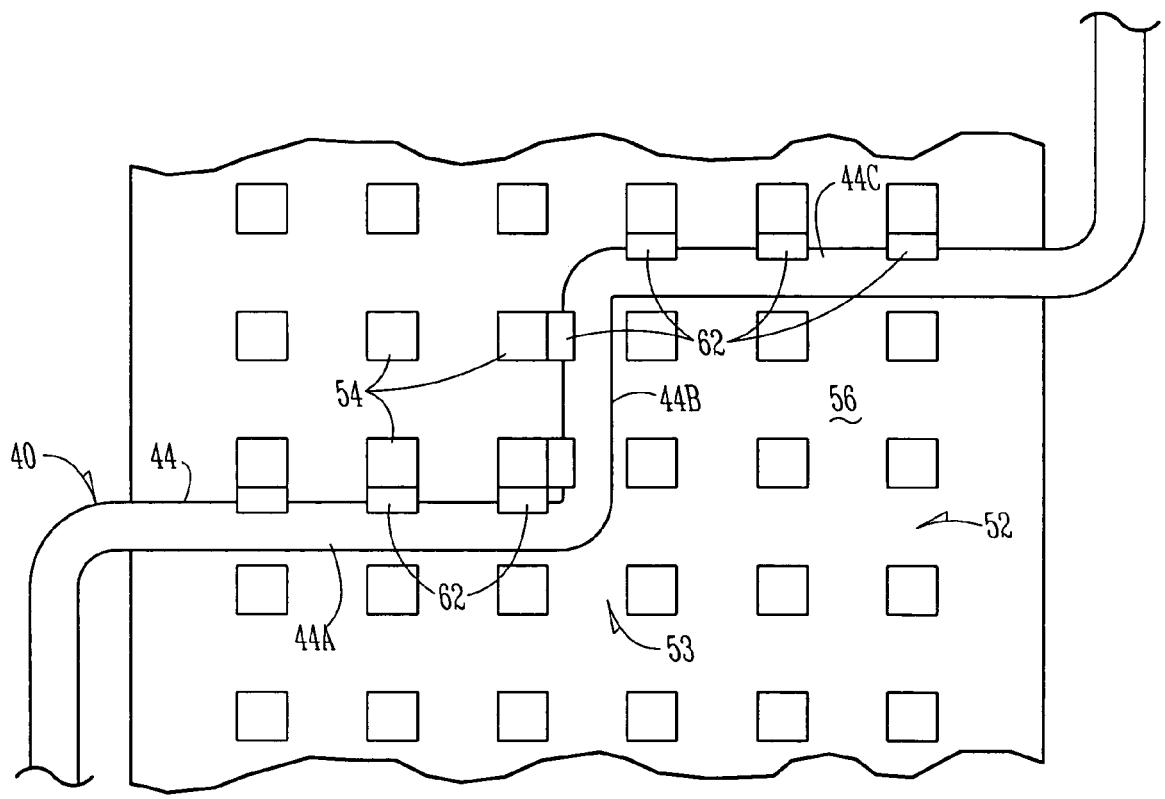
FIGS. 13–16 are top views of further embodiments of heat sink clip retention apparatus in accordance with the present invention.

The present invention provides geometric features for restraining the heat sink from moving or shifting laterally in the plane of the device as well as from lifting vertically off of the electronic device upon which it is mounted. For example, FIG. 13 is a top view of an embodiment in a heat sink clip 40 providing longitudinal and transverse lateral restraining as well as vertical restraining characteristics. Clip 40 includes a central portion 44 comprised of a first portion 44A, a second portion 44B adjacent to and substantially perpendicular to the first portion 44A, and a third portion 44C which is adjacent to and substantially perpendicular to the second portion 44B and substantially parallel with the first portion 44A. In this embodiment, the first, second, and third portions 44A, 44B and 44C are substantially coplanar.

In the embodiment of FIG. 13, heat sink 10 is restricted from moving laterally in the plane of the electronic device by the geometric features provided by bends in the central portion 44 of clip 40 which allow portions of it to be inserted in both longitudinal grooves 52 and transverse grooves 53 that are oriented substantially perpendicular to each other. In the embodiment shown, segment 44A of clip 40 lies in a first longitudinal groove 52, segment 44B, which is substantially perpendicular to segment 44A, lies in a transverse groove 53 which is perpendicular to longitudinal groove 52. Finally, segment 44C lies in a further longitudinal groove 52 that is displaced from first longitudinal groove 52 and is substantially perpendicular to transverse groove 53. Because of the placement of portions of clip 40 in the perpendicularly oriented grooves 52 and 53, heat sink 10 is restricted from moving laterally in the plane of the electronic device and the lateral plane of the view shown in FIG. 13. With the heat sink 10 being restricted from both longitudinal and transverse lateral movement while also being secured from vertical movement perpendicular to the plane of the drawing of FIG. 13, heat sink 10 will be retained in its desired position relative to the electronic device 20 upon which it is mounted.

Figure 14:
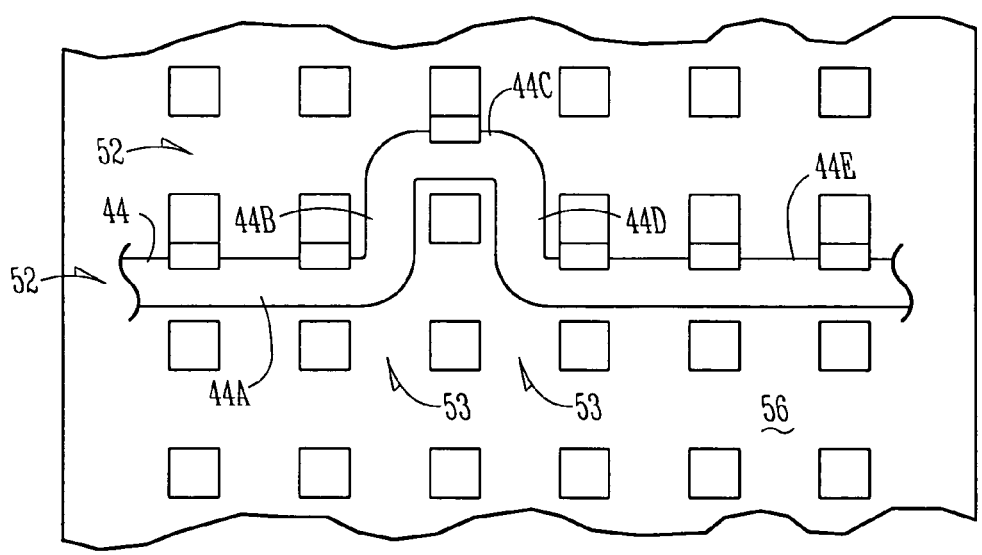

FIG. 14 is a top view of another embodiment where a central portion 44 including a first portion 44A, a second portion 44B adjacent and perpendicular to the first portion 44A, a third portion 44C adjacent and perpendicular to the second portion 44B and parallel with the first portion 44A, a fourth portion 44D adjacent and perpendicular to the third portion 44C and parallel with the second portion 44B, and a fifth portion 44E adjacent and perpendicular to the fourth portion 44D and substantially collinear with the first portion 44A. The second, third and fourth portions 44B, 44C and 44D are adapted to provide a geometric feature which places portions of the central portion 44 of clip 40 in perpendicularly intersecting grooves 52 and 53 to secure heat sink 10 against movement laterally and transversely in the plane of the drawing of FIG. 14. A portion of the central portion of clip 44 can also be said to partially encircle at least one pin 54, to restrict movement of the heat sink 10 both laterally and transversely in the horizontal plane while also securing it vertically. In the embodiment shown in FIG. 14, the first, second, third, fourth, and fifth portions 44A, 44B, 44C, 44D and 44E are all substantially coplanar and parallel to surface 56 of heat sink 10.

Figure 15:
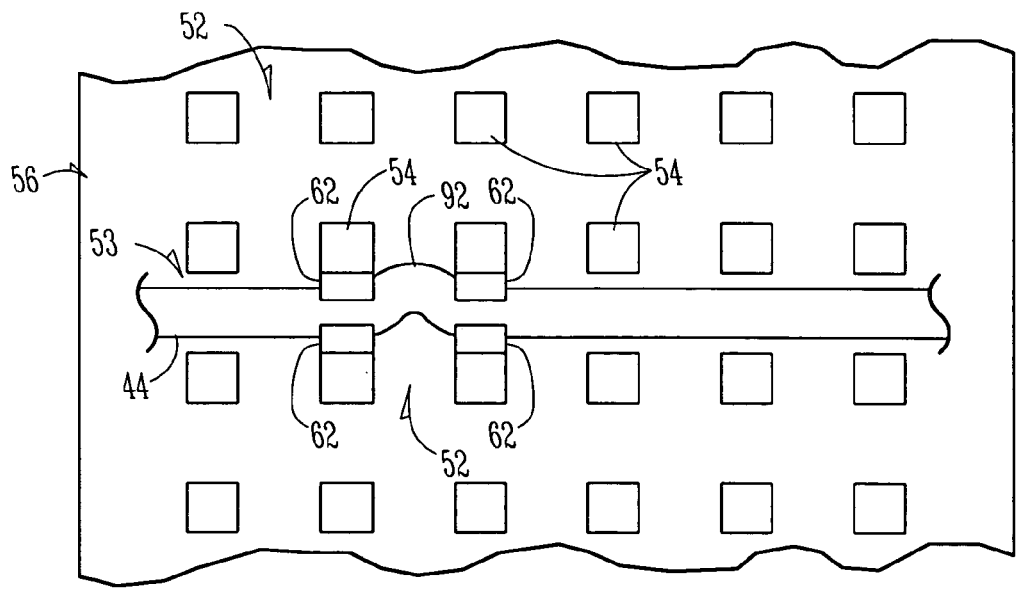

FIG. 15 relates to another embodiment and shows a lateral restraining of the clip central portion 44 including several bends that combine to comprise a geometric feature or "kink" 92 in the portion oriented to lie in the plane of surface 56 of heat sink 10. Kink 92 protrudes into perpendicular groove 52 when the distal ends of central portion 44 are inserted into longitudinal groove 53. Kink 92 is positioned between and restrained by opposing pins 54 with two protrusions 62 flanking geometric feature 92 and thereby substantially preventing lateral movement of the heat sink 10.

Figure 16:
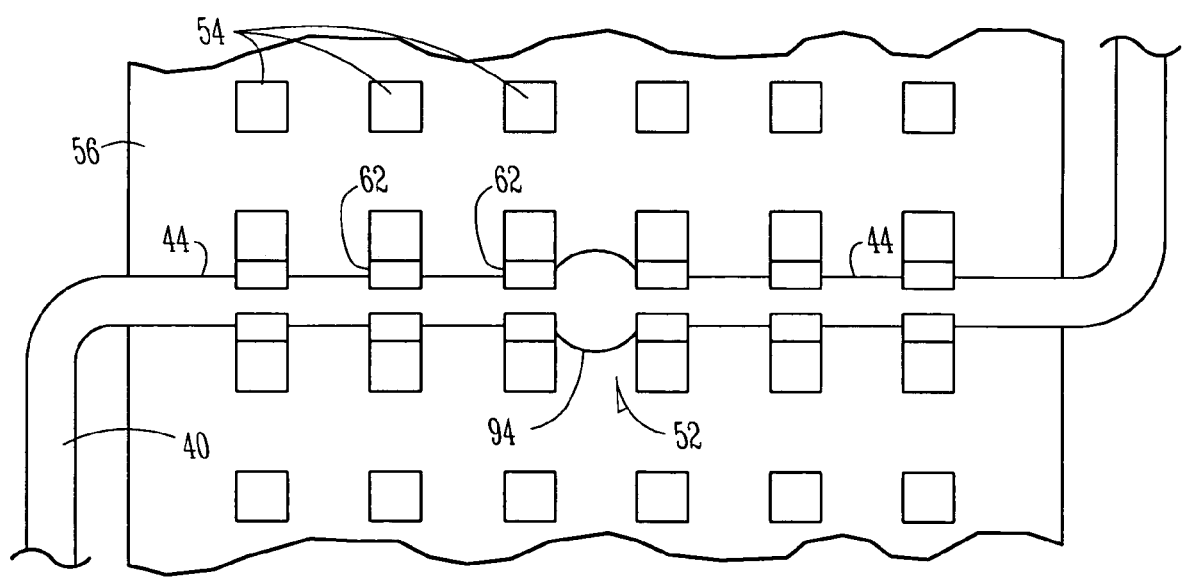

FIG. 16 relates to another embodiment showing of a lateral restraint of clip portion 44. Central portion 44 has a geometric feature which is a deformation or bulge 94 formed in central portion 44 so that a portion of the geometric feature projects into transverse groove 53 to provide a restraint against longitudinal movement along the axis of central portion 44. The geometric feature portion 94 restricts transverse longitudinal movement of the heat sink 10 in groove 52 while the central portion 44 of the clip 40 restricts transverse lateral movement of the heat sink 10 relative to clip 40.

In one embodiment, the heat sink geometric feature 94 which provides lateral restraint is formed by a squeezing action of a crimping tool. The crimping tool permanently flattens a portion of the central portion 44 of the clip 40 to form the bulge 94 which extends transversely into one of the transverse grooves 53 to inhibit longitudinal lateral movement. In one embodiment, deformed portion 94 is formed prior to the insertion of the clip 40 into the longitudinal groove 52.

In another embodiment, the geometric feature provided by the deformed portion 94 is formed after the insertion of the clip 40 into the groove 52. In that embodiment, a location on the central portion 44 is chosen where there is an intersection of two perpendicularly intersecting grooves 52 and 53. In one embodiment, a metal working tool is used to compress the chosen portion of the central portion 44 between a surface of the tool and the heat sink second surface 56 forming the deformed portion 94. Deformed portion 94 is adapted to extend into the groove 52 and thereby restrain lateral movement of the heat sink 10.

Figure 17:
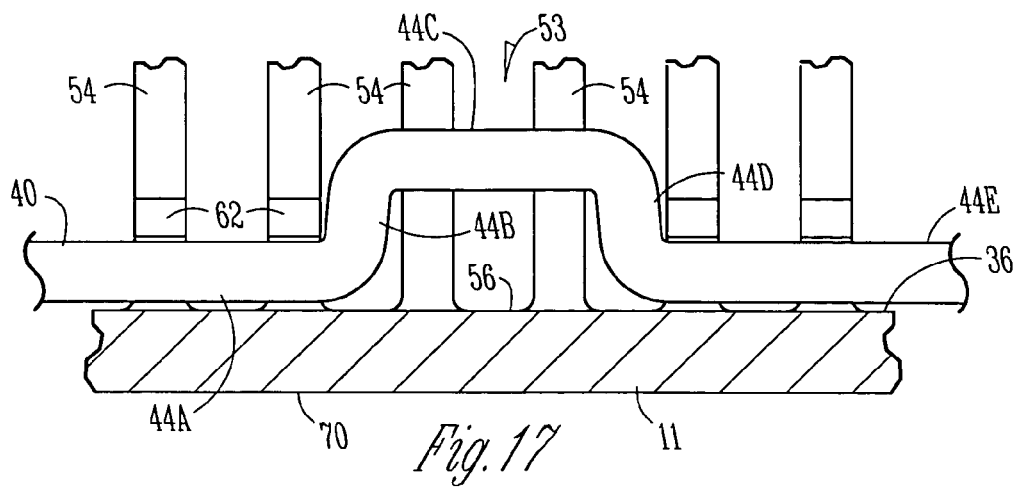
FIGS. 17–20 are cross sectional detail elevation views of further embodiments of heat sink clip retention apparatus.

FIG. 17 shows a detail cross section elevation view of another embodiment. The central portion 44 of the clip 40 bends to provide a geometric feature which is a raised portion 44C which is parallel to and above surface 56 of heat sink 10 between two non-raised clip portions 44A and 44E that are routed closely adjacent to surface 56. The raised portion 44C is adapted to cooperate with the retaining members 62 from pins 54 to secure clip portions 44A and 44E from vertical movement away from surface 56. Clip portions 44A and 44E are captured between adjacent retaining member 62 and surface 56 and prevent the clip from being vertically withdrawn from the groove 52. The raised portion 44C extends above the space between retaining members 62 and the surface 56. The raised portion 44C is adapted such that transition portions between segments 44A and 44E and raised portion 44C abuts retaining members 62 to allow them to substantially restrict lateral movement of the heat sink 10 relative to clip central portion 44.

Figure 18:
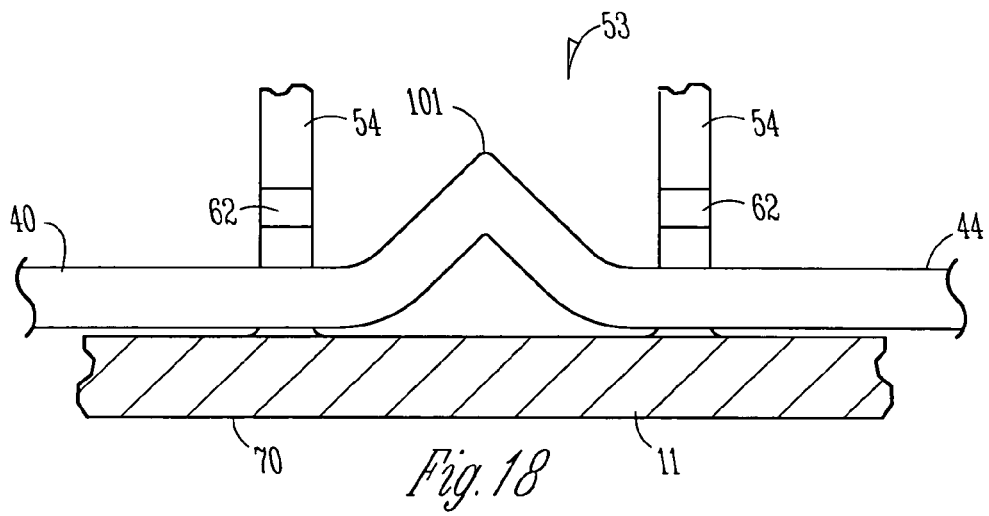

It is understood that in various embodiments heat sink geometric features can comprise many forms and still cooperate with pins 54 and restrain lateral motion of the heat sink 10 relative to retaining clip 40. FIG. 18 shows a cut-away view of another embodiment constructed in accordance with the present invention. The central portion 44 of clip 40 has a raised portion 101 comprising an inverted V-shaped kink which engages one or more retaining members 62 from pins 54 on the sides of the groove 52 containing the central portion 44 of clip 40 to prevent substantially all movement of the heat sink 10 relative to clip 40.

Figure 19:
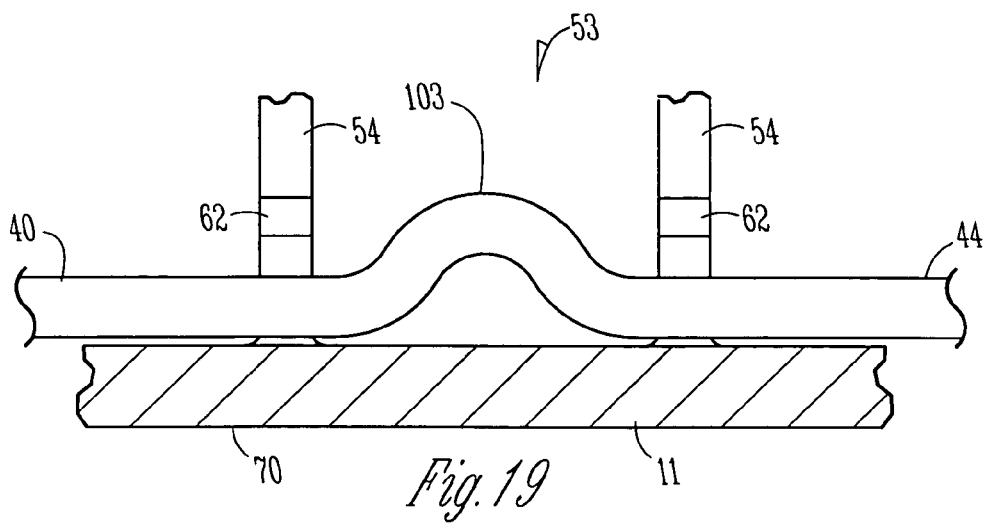

FIG. 19 provides a cut-away view of another embodiment in accordance with the present invention. The central portion 44 bends to a raised portion 103 comprising an inverted U-shaped kink which provides the necessary interference with one or more retaining members 62 to substantially prevent longitudinal movement of the heat sink 10 along the central portion 44 of the clip.

Figure 20:
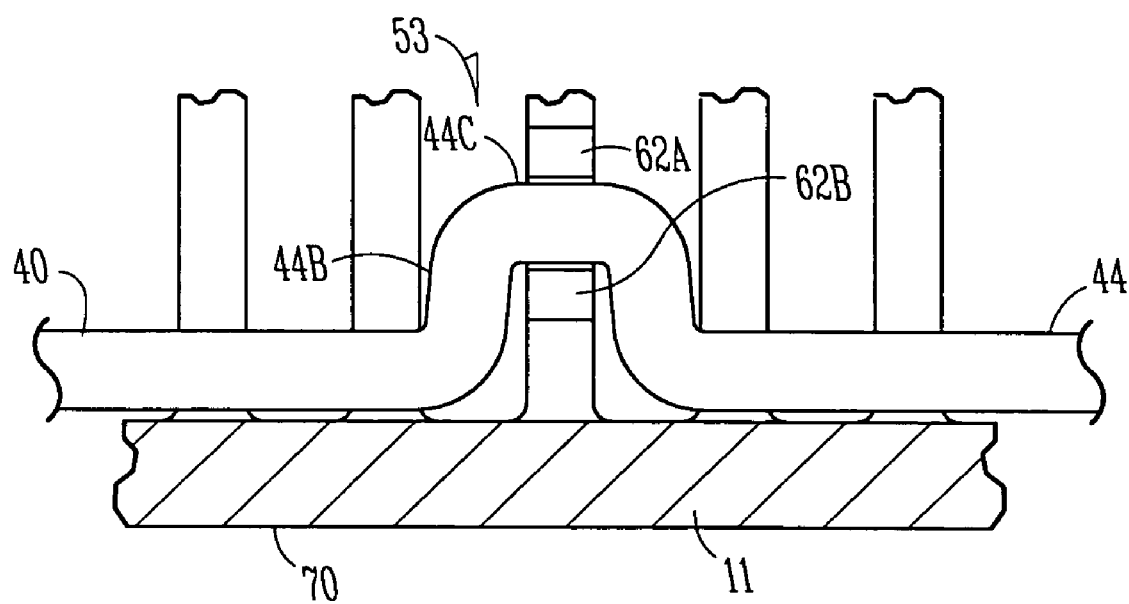

FIG. 20 illustrates, in cross-section, another embodiment in accordance with the present invention. The raised portion 44C cooperates with two abutting retaining members 62A and 62B from a single pin 54 above and below raised portion 44C so that portion 44C is captured between the two retaining members 62A and 62B. The raised portion 44C abuts the retaining members 62A and 62B to substantially prevent lateral movement of the heat sink 10 relative to along central portion 44 and parallel to surface 56 as well as restraining it vertically. In one embodiment restraining member 62A is formed after clip 40 is seated in slot 52 and locks it in place. Thus, the geometry features provided by the bends on central portion 44 of the clip 40 restrain it from movement relative to heat sink 10. Many other interlocking combinations of retaining members 62 and geometrical features of clip 40 will also serve to lock it to heat sink 10 to restrain undesired movement of heat sink 10 relative to the cooled electronic device.

It can also be appreciated, and is within the scope of this invention, that various geometric configurations of the central portion 44 of clip 40 will also restrict undesired movement of the clip 40 relative to the heat sink 10. For example, in yet another embodiment, not shown, at least a portion of central portion 44 is not aligned with either a groove 52 or a groove 53 but may be placed in a diagonally oriented groove running between pins 54 where it will still contribute to securing heat sink 10 from lateral movement in the plane of the electronic device.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of securing a heat sink to an electronic device, comprising:
   positioning the heat sink with a first surface thereof in thermal contact with a surface of the electronic device, a second surface thereof having a plurality of pins extending therefrom; inserting at least a portion of a transversely extending central portion of a clip into a transverse groove between adjacent rows of pins; the transversely extending central portion of the clip having a longitudinally projecting geometrical feature therein to extend into at least one of the rows of pins to prevent movement of the clip relative to the heat sink.

2. The method of claim 1, also comprising forming a retaining member on at least one of the pins adjoining one of the grooves for retaining central portion of the clip in the groove.

3. The method of claim 2, wherein the forming of the retaining member is performed after inserting the clip central portion in the groove.

4. The method of claim 1, also comprising bending at least a pair of pins positioned on opposite sides of a groove of towards each other to secure the central portion of the clip in the groove.

5. The method of claim 1 wherein at least one retaining projection is provided on a mounting frame for receiving a leg portion extending from at least one end of the central portion of the clip to secure the heat sink to the mounting frame.

6. The method of claim 5 wherein two retaining projections are tabs provided on the mounting frame for receiving leg portions extends from each end of the central portion of clip, the two tabs positioned on opposite sides of the central portion of the clip to twist the central portion of clip in opposite directions to secure the retaining clip under their respective tabs.

7. A method of securing a heat sink to an electronic device, comprising:
   positioning the heat sink with a first surface thereof in thermal contact with a surface of the electronic device, a second surface thereof having a plurality of fins extending therefrom in substantially parallel rows;
   positioning at least a portion of a transversely extending central portion of a clip into a transverse groove between adjacent fins; and forming a retention member on at least one fin adjacent the groove to restrain the central portion of the clip from vertical movement in the groove.

8. The method of claim 7 wherein at least one retaining projection is provided on a mounting frame for receiving a leg portion extending from at least one end of the central portion of the clip to secure the heat sink to the mounting frame.

9. The method of claim 8 wherein two retaining projections are tabs provided on the mounting frame for receiving leg portions extends from each end of the central portion of clip, the two tabs positioned on opposite sides of the central portion of the clip to twist the central portion of clip in opposite directions to secure the retaining clip under their respective tabs.

10. A method of securing a heat sink to an electronic device, comprising:
positioning the heat sink with a first surface thereof in thermal contact with a surface of the electronic device, a second surface thereof having a plurality of pins extending therefrom;
positioning transversely extending portion of a central portion of a clip into a transverse groove between adjacent rows of pins; and
positioning a longitudinally extending portion of a central portion of the clip into a longitudinal groove between adjacent rows of pins, the transversely extending portion and the longitudinally extending portions substantially preventing movement of the clip relative to the heat sink.

11. The method of claim 10 wherein at least one retaining projection is provided on a mounting frame for receiving a leg portion extending from at least one end of the central portion of the clip to secure the heat sink to the mounting frame.

12. The method of claim 11 wherein two retaining projections are tabs provided on the mounting frame for receiving leg portions extends from each end of the central portion of clip, the two tabs positioned on opposite sides of the central portion of the clip to twist the central portion of clip in opposite directions to secure the retaining clip under their respective tabs.

13. Apparatus comprising:
a frame;
an electronic device mounted to the frame;
a heat sink plate having a plurality of pins extending from a first surface thereof, the pins arranged in intersecting transverse and longitudinal rows defining transverse and longitudinal valleys there between; and
a retaining clip having at least one leg portion thereof to couple to the frame and having a central portion thereof to engage the first surface of the plate to force a second surface of the plate into thermal contact with a surface of the electronic device, the clip central portion having at least one geometric feature, the central portion positioned to lie in at least a portion of a longitudinal valley with the geometric feature extending into at least one transverse valley for a distance exceeding a distance between adjacent pins in the transverse valley to limit longitudinal and transverse lateral movement of the heat sink relative to the surface of the device.

14. The apparatus of claim 13, wherein:
the geometric feature is formed after insertion of the clip central portion into the valley.

15. The apparatus of claim 13 wherein at least two geometric features project into the valley from pins on both sides of the valley.

16. The apparatus of claim 13, wherein the geometric feature projecting from the pin comprises a downwardly-sloping wedge.

17. The apparatus of claim 13, wherein at least two pins on opposite sides of the valley are bent toward each other into the valley to restrain the clip central portion from movement away from the first face of the heat sink plate.

18. The apparatus of claim 13, wherein the geometric feature comprises at least one bend in the clip central portion adapted for engaging at least one pin adjacent the valley.

19. The apparatus of claim 18, wherein the bend is oriented to maintain the clip central portion in a plane oriented substantially parallel to the first face of the heat sink.

20. The apparatus of claim 18, wherein the bend is oriented to maintain the clip central portion in a plane oriented substantially perpendicular to the first face of the heat sink.

21. The apparatus of claim 13, wherein the geometric feature comprises a widening of the clip central portion between adjacent pins along one of the rows of pins defining the valley for insertion of the clip central portion.

22. The apparatus of claim 13, wherein at least one of the pins adjacent the valley has a retaining member projecting from it into the valley for retaining a clip central portion in the valley to maintain contact between the second face of the heat sink plate and the surface of the device.

23. The apparatus of claim 13, wherein the clip further comprises more than one leg portions, one leg portion extending from a first end of the clip and another leg portion extending at an angle to the clip, the clip to position the leg portions adjacent opposite sides of the heat sink, the leg portions to couple with the frame.

24. The apparatus of claim 13 wherein the frame includes at least one projecting tab to secure at least one leg portion of the clip.

* * * * *

UNITED STATES PATENT AND TRADEMARK OFFICE
CERTIFICATE OF CORRECTION

PATENT NO. : 7,142,429 B2  Page 1 of 1
APPLICATION NO. : 11/230875
DATED : November 28, 2006
INVENTOR(S) : Hsieh et al.

It is certified that error appears in the above-identified patent and that said Letters Patent is hereby corrected as shown below:

On the title page, item (56), under "U.S. Patent Documents", in column 2, line 12, delete "Nevelie" and insert -- Neville --, therefor.

On the Title page, item (56), under "U.S. Patent Documents", in column 2, line 14, after "Lo" insert -- et al. --.

Signed and Sealed this

First Day of July, 2008

JON W. DUDAS
*Director of the United States Patent and Trademark Office*